(12) United States Patent
Wang

(10) Patent No.: US 7,148,569 B1
(45) Date of Patent: Dec. 12, 2006

(54) PAD SURFACE FINISH FOR HIGH ROUTING DENSITY SUBSTRATE OF BGA PACKAGES

(75) Inventor: Wen-Chou Vincent Wang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/936,196

(22) Filed: Sep. 7, 2004

(51) Int. Cl.
*H01L 23/48* (2006.01)
*H01L 23/52* (2006.01)

(52) U.S. Cl. ............... 257/738; 257/748; 257/762; 257/778; 257/779; 257/780

(58) Field of Classification Search ........... 257/737, 257/738, 741, 748, 772, 777–780, 785
See application file for complete search history.

(56) References Cited

U.S. PATENT DOCUMENTS 6,326,088 B1 * 12/2001 Mayer et al. ............ 428/615

2004/0046264 A1 * 3/2004 Ho et al. ............... 257/778

* cited by examiner

*Primary Examiner*—Hung Vu
(74) *Attorney, Agent, or Firm*—Morgan, Lewis & Bockius LLP

(57) ABSTRACT

The present invention is directed to a new bonding pad structure that includes a copper pad and a pad surface finish comprising multiple layers of solder. The multiple layers of solder include at least a layer of eutectic solder (or a layer of pure-Sn solder) covering the copper pad and a layer of high-Pb solder covering the layer of eutectic solder (or the layer of pure-Sn solder). Since the layer of high-Pb solder is significantly thicker than the eutectic solder layer (or the layer of pure-Sn solder), there is insufficient tin supply in the eutectic solder (or the layer of pure-Sn solder) for forming a thick Cu/Sn intermetallic layer on the copper pad. Instead, a thin Cu/Sn intermetallic layer is formed on the copper pad and there is less likelihood of forming a crack in the thin Cu/Sn intermetallic layer.

10 Claims, 6 Drawing Sheets

PAD SURFACE FINISH FOR HIGH ROUTING DENSITY SUBSTRATE OF BGA PACKAGES

The present invention relates generally to an electronic package and, in particular, to a new bonding pad surface finish that can be used to create a ball grid array (BGA) substrate having a high routing density.

BACKGROUND OF THE INVENTION

This relates to electronic packages that contain an integrated circuit (IC) typically fabricated on a semiconductor die. The package protects the IC from the environment and provides I/O interfaces for the IC to communicate with other circuits.

FIG. 1 is a cross-sectional view of a prior art BGA package including a BGA substrate 100 and a semiconductor die 120 on the surface of the substrate 100. The semiconductor die carries an electronic circuit, e.g., a programmable logic device (PLD). The substrate includes a multitude of conductive paths running from an array of solder bumps 130 on one side of the substrate to an array of solder balls 160 on the other side of the substrate. The array of solder bumps 130 is located between the semiconductor die 120 and the substrate 100. After reflowing in a high temperature environment, e.g., 220° C., this array of solder bumps 130 forms an array of solder joints that connects the electronic circuit's I/O structures from the semiconductor die 120 to the substrate 100. An underfill layer 140 is injected into the space between the die 120 and the substrate 100 to reduce stress concentration at the solder joints and prevent electrical open failures caused by any disconnected solder joint. A heat spreader 180 may be positioned on top of the semiconductor die 120 and the substrate 100 to dissipate the heat generated by the package. A layer 150 of thermal interface material may be deployed between the die 120 and the heat spreader 180 to improve the package's heat transfer efficiency. The array of solder balls 160 is attached to an array of bonding pads 170 on the bottom side of the substrate 100, each solder ball being connected to one or more solder joints on the top side of the substrate 100 by one of the conductive paths in substrate 100. In a typical application, multiple BGA packages like the one shown in FIG. 1 are attached to a printed wiring board 190 by reflowing the solder balls 160 in a high temperature environment.

Copper traces in a BGA substrate are used as conductive paths, and each conductive path typically ends at a copper pad on each of the two sides of the substrate. To prevent a copper pad from being oxidized, its surface is often covered with a pad surface finish. A high-quality pad surface finish, in addition to insulating the copper pad from oxidization, is also expected to form a solid physical bond between the attached solder ball and the copper pad that is able to survive in extreme environments. The electroless Ni and immersion gold (ENIG) finish, one of the most popular pad surface finishes used in the industry, has been proven to be quite vulnerable when it is subject to shock impacts that occur frequently during shipment. In contrast, the solder-on-pad (SOP) finish significantly outperforms the ENIG finish in terms of shock resistance. Unfortunately, the SOP finish often behaves poorly during the board-level reliability (BLR) test, which is another critical factor when choosing an appropriate pad surface finish for a copper pad.

FIG. 2A is an enlarged cross-sectional view of a prior art bonding pad structure 200 at the bottom side of a substrate 205 before a solder ball is attached to its surface. The structure includes a copper pad 210 that is covered with a layer of solder mask 240 on its peripheral edge. The solder mask originally covering the central region of the copper pad 210 has been removed and the exposed pad surface is covered with a SOP finish 230 to protect it from oxidization. The SOP finish 230 is typically made of eutectic solder (63% Sn-37% Pb). As a result, a Cu/Sn intermetallic layer 235 is formed between the copper pad 210 and the SOP finish 230. Generally, the thickness of the Cu/Sn intermetallic layer is not uniform and its average is about 1–2 microns before solder reflow, i.e., a solder ball is attached to the bonding pad. However, the average thickness of the Cu/Sn intermetallic layer may grow to about 2.5–3.5 microns after multiple solder reflows. Mechanically, the Cu/Sn intermetallic layer is very brittle and it may easily break apart when subject to frequent thermal cycles.

FIG. 2B schematically illustrates the structure of FIG. 2A with a solder ball 250 attached to the copper pad 210 through solder reflow. A comparison of the bonding pad structure 200 before and after the solder reflow indicates that the Cu/Sn intermetallic layer 235 has become thicker since more tin in the SOP finish 230 has been absorbed into the layer 235. As a result, when a BGA package including the bonding pad structure 200 is subjected to a BLR thermal cycle test, a crack 237 may develop in the Cu/Sn intermetallic layer 235 that disconnects the solder ball 250 from the copper pad 210, causing an electrical open failure to the package.

SUMMARY OF THE INVENTION

The present invention is directed to a new bonding pad structure for reducing the likelihood of cracks in the Cu/Sn intermetallic layer. In a preferred embodiment of the invention, the bonding pad structure includes a copper pad and a pad surface finish comprising multiple layers of solder. The multiple layers of solder include at least a layer of eutectic solder (or a layer of pure-Sn solder) covering the copper pad and a thicker layer of high-Pb solder covering the layer of eutectic solder (or the layer of pure-Sn solder). Since the layer of high-Pb solder is thicker than the eutectic solder layer (or the layer of pure-Sn solder), there is insufficient tin to form a thick Cu/Sn intermetallic layer on the copper pad. Instead, a thin Cu/Sn intermetallic layer is formed on the copper pad and there is less likelihood of a crack forming in the thin Cu/Sn intermetallic layer. Therefore, this new bonding pad structure is more reliable than the conventional bonding pad structure.

BRIEF DESCRIPTION OF THE DRAWINGS

The aforementioned features and advantages of the invention as well as additional features and advantages thereof will be more clearly understood hereinafter as a result of a detailed description of preferred embodiments of the invention when taken in conjunction with the drawings.

DETAILED DESCRIPTION OF THE EMBODIMENTS

Figure 1:
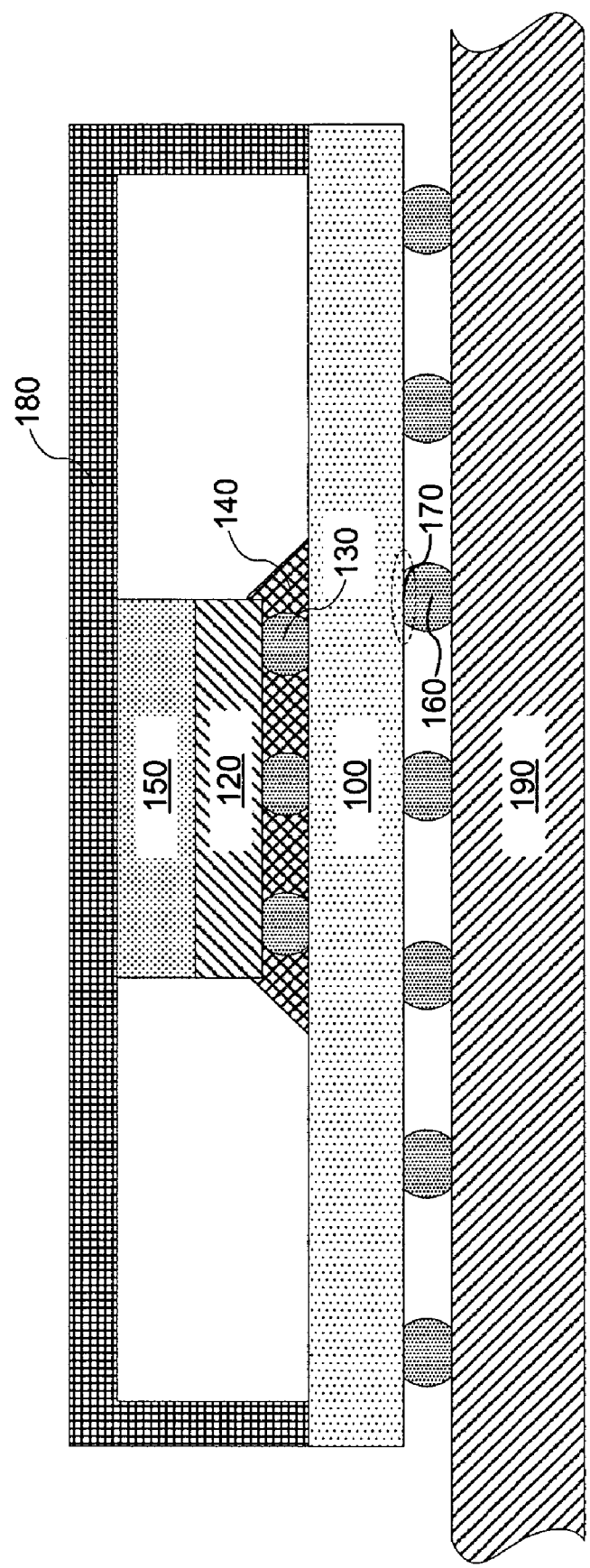
FIG. 1 is a cross-sectional view of a prior art BGA package before it is attached to a printed wiring board.
Figure 2A:
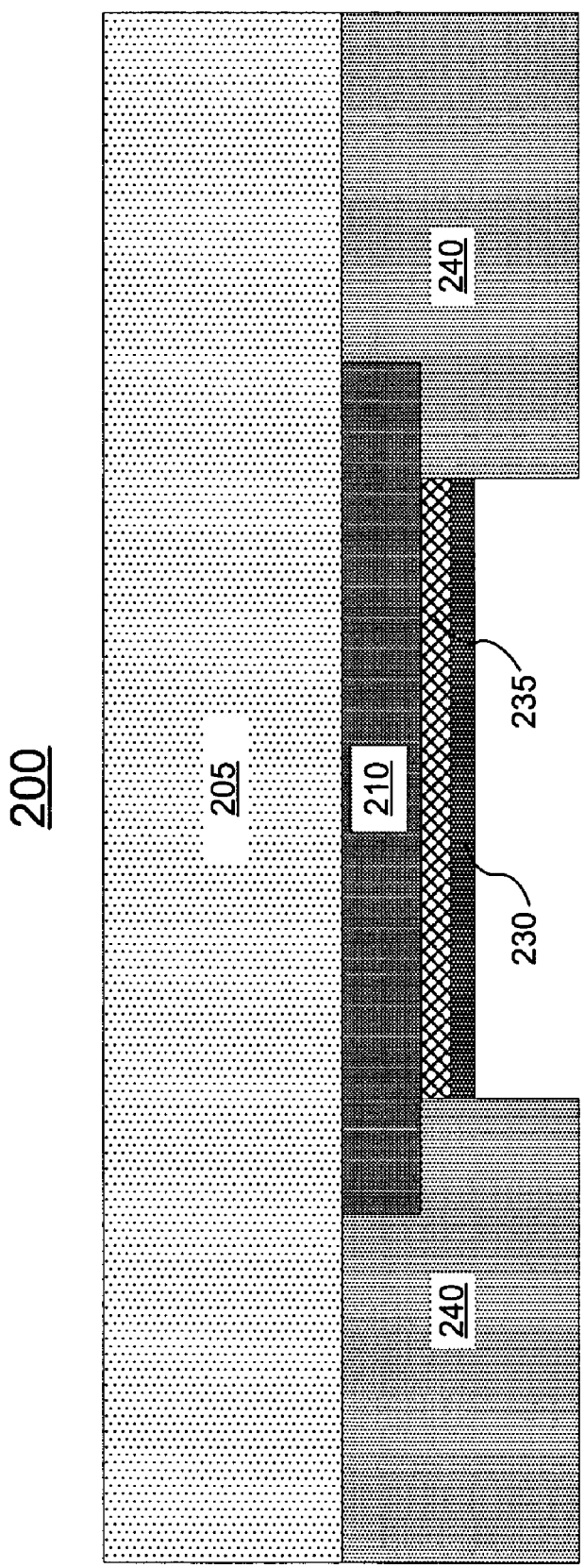
FIGS. 2A and 2B are enlarged cross-sectional views of a prior art bonding pad structure at the bottom side of a substrate before a solder ball is formed on its surface and after the solder joint is disconnected from the bonding pad surface by a crack in the Cu/Sn intermetallic layer.
Figure 2B:
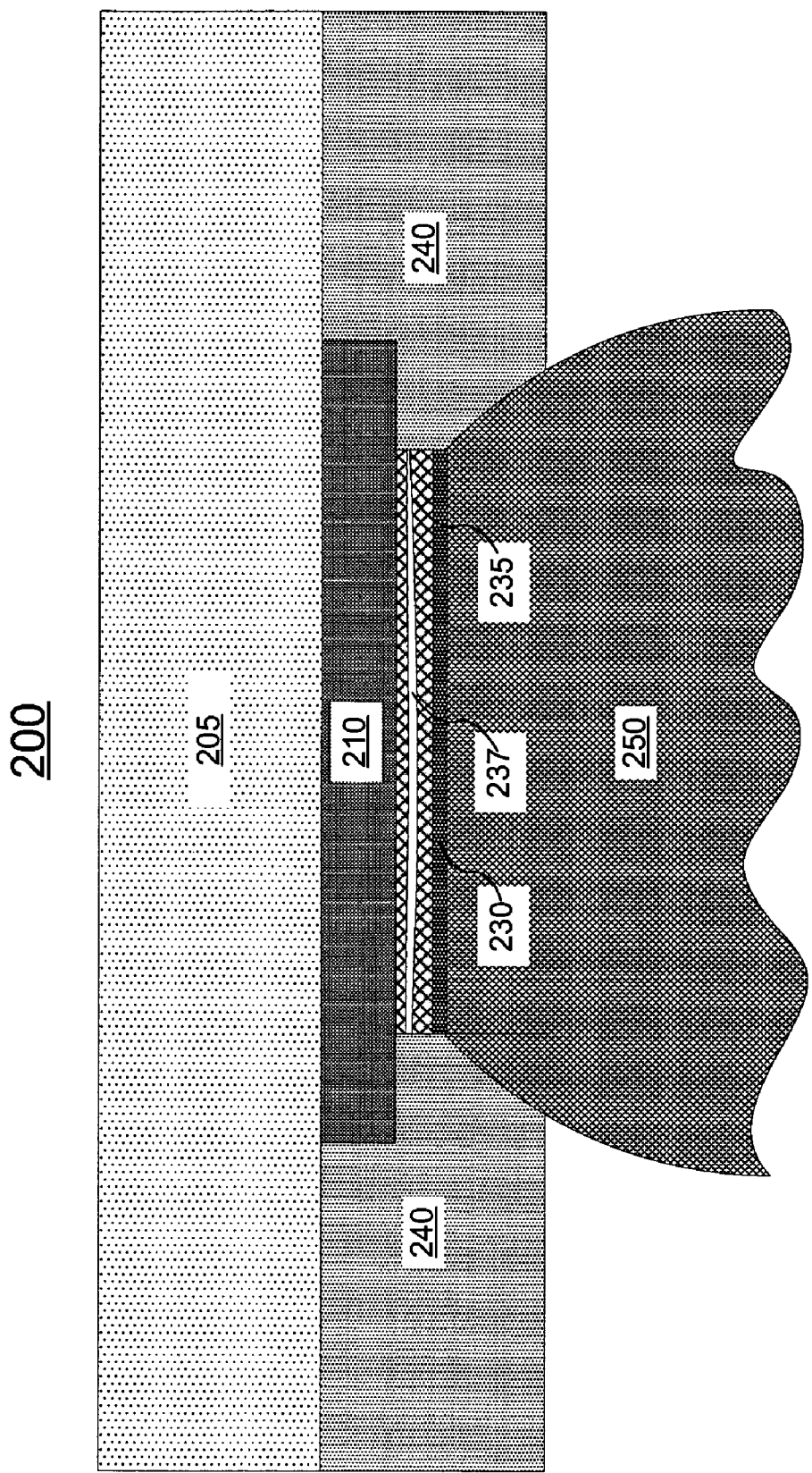
Figure 3A:
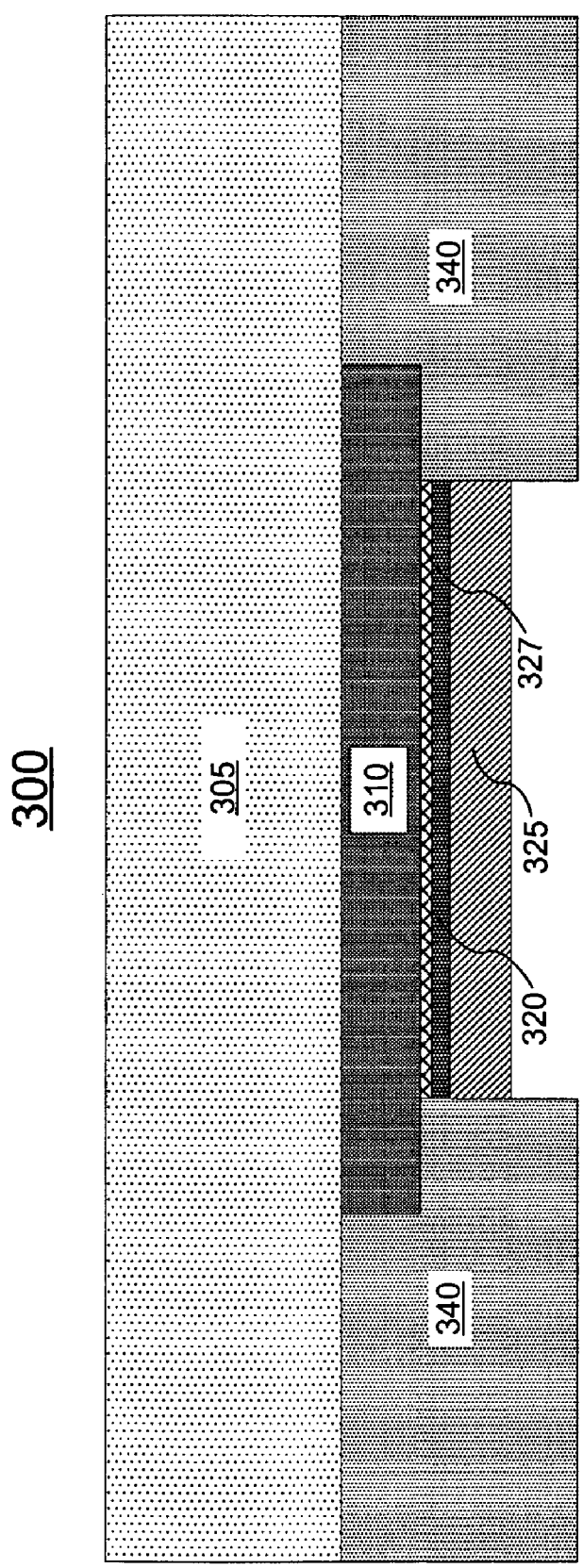
FIGS. 3A and 3B are enlarged cross-sectional views of a bonding pad structure at the bottom side of a substrate according to one embodiment of the present invention.

FIG. 3A is an enlarged cross-sectional view of a bonding pad structure 300 formed according to one embodiment of the present invention. While bonding pad structure 300 is shown formed on the bottom side of a substrate 305, it can also be formed on the top side of substrate 305. Compared with the SOP finish 230 in FIG. 2A, this bonding pad structure has a different type of pad surface finish that includes multiple layers of solder. This structure is formed by first depositing a layer of eutectic solder 320 on the surface of the copper pad 310 through processes such as screen printing or plating. This layer covers the copper pad. Second, a layer of high-Pb solder 325 is deposited on the surface of the layer of eutectic solder 320 again using processes such as screen printing or plating. The composition of the high-Pb solder is at least 80% lead and at most 20% tin. In one embodiment, the composition of the high-Pb solder is 95% lead and 5% tin. The layer of high-Pb solder 325 is thicker than the layer of eutectic solder 320. For example, the thickness of the eutectic solder layer 320 is about 5–10 microns, while the thickness of the high-Pb solder layer 325 is about 10–50 microns.

In some other embodiments, a layer of pure-Sn solder may be used to replace the layer of eutectic solder, and the layer of pure-Sn solder is formed on the copper pad 310 through processes like tin flash, plating or printing. The thickness of the layer of pure-Sn solder is about 2–10 microns.

Like the bonding pad structure in FIG. 2A, a Cu/Sn intermetallic layer 327 is formed between the eutectic solder layer 320 and the copper pad 310 due to their direct physical contact. However, this Cu/Sn intermetallic layer 327 is significantly thinner than the layer 235, because (1) the layer of eutectic solder 320 is thinner than that of the SOP finish 230 and there is less tin supply for the formation of the Cu/Sn intermetallic layer 327, and (2) the layer of high-Pb solder 320 serves as a sink that further drains the tin supply by absorbing the tin from the eutectic solder layer into itself. In some embodiments, the thickness of the Cu/Sn intermetallic layer 327 is less than 1 micron.

Figure 3B:
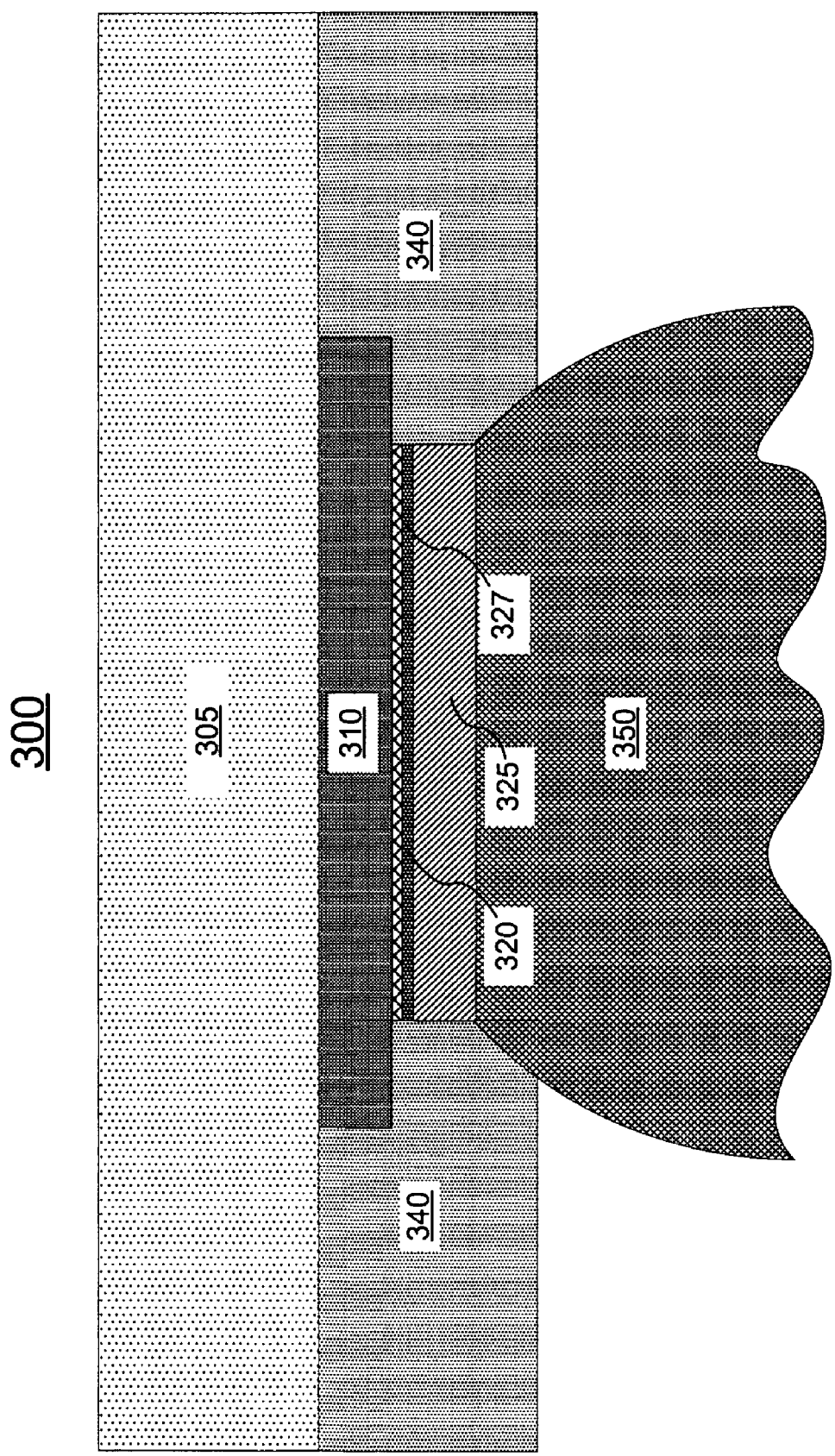

FIG. 3B depicts bonding pad structure 300 with a solder ball 350 attached to copper pad 310 through solder reflow. Even after solder reflow, the thickness of layer 327 is still well below 2 microns as shown in FIG. 3B. As a result, the chance of forming a crack in the thin Cu/Sn intermetallic layer 327 is substantially reduced and the solder ball 350 attached to the bonding pad structure 300 enjoys a much longer life expectancy than that of a conventional bonding pad structure.

Figure 4:
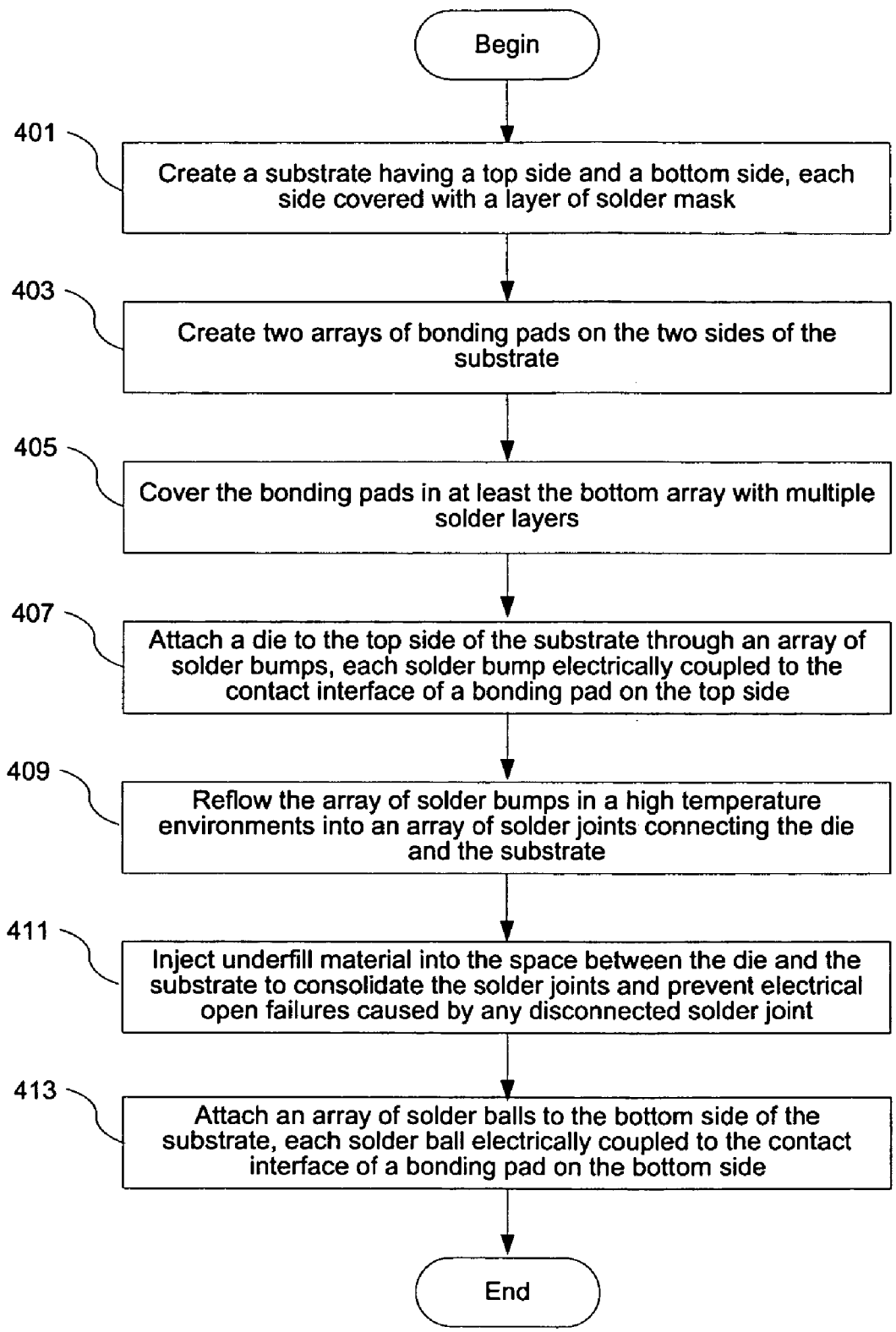
FIG. 4 is a flowchart illustrating the process of creating a BGA package according to one embodiment of the present invention.

FIG. 4 is a flowchart illustrating a process of creating a BGA package according to one embodiment of the present invention. The process begins at step 401 with creating a substrate having a top side and a bottom side. The substrate typically includes a substrate core, a plurality of insulation layers and a plurality of conductive layers and two layers of solder mask, one covering the top side and the other covering the bottom side of the substrate. In step 403 the solder mask layers on the two sides of the substrate are then removed at selected locations to expose the embedded conductive layers and create two arrays of bonding pads, one array on the top side and the other array on the bottom side. In at least the array of bonding pads on the bottom side and optionally in both arrays, each of the bonding pads is covered with multiple layers of solder at step 405, e.g., a thin layer of eutectic solder and a thick layer of high-Pb solder. Illustratively, the coverings are deposited one-after-the-other by screen printing or plating. Next, at step 407, a semiconductor die is attached to the top side of the substrate through an array of solder bumps, each solder bump electrically coupled to the contact interface of one bonding pad on the top side. The package is then positioned in a high temperature environment (e.g., 220° C.) at step 409, which reflows the array of solder bumps into an array of solder joints between the die and the substrate. This reflow process also results a thin Cu/Sn intermetallic layer on the surface of each bonding pad. After that, underfill material is injected into the space between the die and the substrate at step 411 in order to reduce stress concentration at the solder joints and prevent electrical open failures caused by any disconnected solder joint. In some embodiments, a heat spreader is positioned on top of the die and the substrate and a layer of thermal interface material is deployed between the die and the heat spreader to dissipate the heat generated by the package. Finally, at step 413, an array of solder balls is attached to the array of bonding pads on the bottom side of the substrate to create the BGA package. The BGA package resulting from this process can then be attached to a printed wiring board to form an electronic application.

The foregoing description, for purpose of explanation, has been made with reference to specific embodiments. However, the illustrative embodiments described above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An electronic product comprising:
   a substrate having a surface;
   an array of bonding pads on the surface of the substrate, each bonding pad having a pad surface finish including multiple layers of solder; and
   an array of solder balls attached to the array of bonding pads, each solder ball electrically coupled to one of the bonding pads through its associated multiple layers of solder,
   wherein each of the bonding pads is made of copper and its associated multiple layers of solder include a layer of eutectic solder covering the bonding pad and a layer of high-Pb solder covering the layer of eutectic solder and the layer of eutectic solder is thinner than the layer of high-Pb solder.

2. The product of claim 1, wherein the layer of eutectic solder has a thickness of 5–10 microns and the layer of high-Pb solder has a thickness of 10–50 microns.

3. The product of claim 1, wherein the layer of high-Pb solder is composed of at least 80% lead and at most 20% tin.

4. The product of claim 1, wherein a Cu/Sn intermetallic layer is formed between the bonding pad and the layer of eutectic solder and the Cu/Sn intermetallic layer has a thickness of less than 2 microns.

5. The electronic product of claim 1 further comprising:
   a semiconductor die attached to a second surface of the substrate through an array of solder bumps interconnecting the semiconductor die and the second surface of the substrate;
   an underfill layer between the semiconductor die and the second surface of the substrate; and
   an encapsulant covering the semiconductor die and the second surface of the substrate.

6. An electronic product comprising:
a substrate having a surface;
an array of bonding pads on the surface of the substrate, each bonding pad having a pad surface finish including multiple layers of solder; and
an array of solder balls attached to the array of bonding pads, each solder ball electrically coupled to one of the bonding pads through its associated multiple layers of solder,
wherein each of the bonding pads is made of copper and its associated multiple layers of solder include a layer of pure-Sn solder covering the bonding pad and a layer of high-Pb solder covering the layer of pure-Sn solder, and the layer of pure-Sn solder is thinner than the layer of high-Pb solder.

7. The package of claim 6, wherein the layer of pure-Sn solder has a thickness of 2–10 microns and the layer of high-Pb solder has a thickness of 10–50 microns.

8. The package of claim 6, wherein the layer of high-Pb solder is composed of at least 80% lead and at most 20% tin.

9. The package of claim 6, wherein a Cu/Sn intermetallic layer is formed between the bonding pad and the layer of pure-Sn solder and the Cu/Sn intermetallic layer has a thickness of less than 2 microns.

10. The electronic product of claim 6 further comprising:
a semiconductor die attached to a second surface of the substrate through an array of solder bumps interconnecting the semiconductor die and the second surface of the substrate;
an underfill layer between the semiconductor die and the second surface of the substrate; and
an encapsulant covering the semiconductor die and the second surface of the substrate.

* * * * *